United States Patent
Dickey

(10) Patent No.: US 12,271,172 B2
(45) Date of Patent: Apr. 8, 2025

(54) SOLID STATE POWER CONTROLLERS

(71) Applicant: Hamilton Sundstrand Corporation, Charlotte, NC (US)

(72) Inventor: John A. Dickey, Caledonia, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 364 days.

(21) Appl. No.: 17/544,720

(22) Filed: Dec. 7, 2021

(65) Prior Publication Data
US 2023/0176538 A1   Jun. 8, 2023

(51) Int. Cl.
| | |
|---|---|
| G05B 19/05 | (2006.01) |
| G05B 9/03 | (2006.01) |
| G06F 1/18 | (2006.01) |
| G06F 1/26 | (2006.01) |
| G06F 11/16 | (2006.01) |
| G06F 11/20 | (2006.01) |

(52) U.S. Cl.
CPC ......... G05B 19/054 (2013.01); G05B 19/058 (2013.01); *G05B 9/03* (2013.01); *G06F 1/189* (2013.01); *G06F 1/26* (2013.01); *G06F 1/266* (2013.01); *G06F 11/1629* (2013.01); *G06F 11/2028* (2013.01); *G06F 11/2038* (2013.01)

(58) Field of Classification Search
CPC .......... G06F 1/26; G06F 1/266; G06F 1/2038; G06F 11/2028; G06F 11/1629; G06F 1/189; G05B 19/054; G05B 19/058; G05B 9/03
USPC .......................................... 713/300; 714/11
See application file for complete search history.

(56) References Cited

U.S. PATENT DOCUMENTS

| | | | | |
|---|---|---|---|---|
| 7,282,899 | B1* | 10/2007 | Daun-Lindberg | G05F 3/185 323/272 |
| 7,511,527 | B1* | 3/2009 | Tiew | G01R 31/275 324/762.08 |
| 7,818,614 | B2* | 10/2010 | Michaelis | G06F 11/165 714/10 |
| 8,704,574 | B2 | 4/2014 | Prabhuk et al. | |
| 9,716,385 | B2* | 7/2017 | Dickey | H02J 4/00 |
| 9,812,873 | B2 | 11/2017 | Fritz et al. | |
| 10,234,829 | B2 | 3/2019 | Dickey et al. | |
| 10,666,042 | B2* | 5/2020 | Dickey | H02H 3/066 |
| 10,790,739 | B1* | 9/2020 | Villano | H02M 1/32 |
| 11,005,254 | B2 | 5/2021 | Handy et al. | |
| 11,632,111 | B1* | 4/2023 | Dickey | G05B 9/03 326/10 |

(Continued)

FOREIGN PATENT DOCUMENTS

EP        0190664 A1    8/1986

OTHER PUBLICATIONS

Extended European Search Report, of the European Patent Office, dated May 3, 2023, in corresponding European Patent Application No. 22208167.1.

*Primary Examiner* — Ji H Bae

(57) ABSTRACT

In accordance with at least one aspect of this disclosure, a system can include a main board, two or more redundant CPUs for any number of channels operatively connected to the main board and two or more power sources operatively connected to provide power to at least one or more of the two or more CPUs. A respective isolated communications block can be operatively connected to each of the two or more CPUs configured to provide external communications from other components on the main board to a respective CPU.

20 Claims, 2 Drawing Sheets

(56) References Cited

U.S. PATENT DOCUMENTS

| | | | |
|---|---|---|---|
| 2004/0156154 A1* | 8/2004 | Lazarovich | H02H 3/08 |
| | | | 361/42 |
| 2006/0200688 A1 | 9/2006 | Tofigh et al. | |
| 2013/0144447 A1 | 6/2013 | Simper et al. | |
| 2013/0207705 A1* | 8/2013 | Prabhuk | H02J 13/00036 |
| | | | 327/202 |
| 2016/0049868 A1 | 2/2016 | Pradier et al. | |
| 2017/0070056 A1* | 3/2017 | Dickey | H02J 4/00 |

* cited by examiner

SOLID STATE POWER CONTROLLERS

TECHNICAL FIELD

The present disclosure relates to solid state power controllers.

BACKGROUND

Many control systems for critical applications require some level of redundancy for fault protection so that if a component fails, other system components can detect the failure and in many cases utilize copies of the failed circuit or other portions of the system to take over the same or similar functionality of the failed component(s).

Typical designs for fabricating solid state power controllers require a considerable amount of support components and isolating devices. As such, the number and size of controllers that can fit on reasonable size board for aircraft applications can be limited.

There remains a need in the art for reduced hardware controller architecture that allows additional controllers to be included on a given size of board. This disclosure provides a solution for this need.

SUMMARY

In accordance with at least one aspect of this disclosure, a system can include a main board, two or more redundant CPUs for any number of channels operatively connected to the main board, two or more control power sources operatively connected to provide power to at least one or more of the two or more CPUs, a logic module configured to provide redundant control source selection between the two or more redundant CPUs, an exclusive OR gate (XOR) operatively connected between the two or more CPUs and a gate driver configured to control a gate drive signal output of both CPUs to generates an output state signal, and a solid state power controller for each channel operatively connected to the two or more redundant CPUs through the XOR to provide power to a load based on the signal provided by a respective CPU.

In embodiments, the controller can include the isolated gate driver operatively connected between the XOR and a transistor, wherein the gate driver is configured to receive the gate drive signal from the respective CPU to drive the transistor between a first and second state. The controller can further include the transistor operatively connected between the gate driver and a load configured to selectively allow power to flow from a feed line and the load. A current sense resistor can be operatively connected to a drain of the transistor configured to sense a current from the feed line to the load.

A buffer amp can be operatively connected between the current sense resistor and the two or more CPUs configured to output a signal indicative of a voltage drop across the current sense resistor to the two or more redundant CPUs. The buffer amp can be configured output the signal indicative of the voltage drop across the current sense resistor to all CPUs. An isolation resistor for each CPU can be operatively connected between the buffer amp and a respective CPU configured to filter the signal indicative of the voltage drop across the current sense resistor to provide isolated feedback from the XOR to the two or more redundant CPUs.

One or more diodes operatively connected between the one or more control power sources and the two or more CPUs, and connected between the one or more control power sources and the isolated gate driver, configured to control a direction of flow of power to the two or more redundant CPUs and the isolated gate driver. In certain embodiments, a respective isolated communications block operatively connected to each of the two or more CPUs.

In certain embodiments, the controller further includes a current sense resistor operatively connected between a source of the transistor and the load configured to sense a current from the feed line to the load. The controller can further include, an analog isolation device operatively connected to the current sense resistor configured to output a signal indicative of a voltage drop across the current sense resistor to the two or more CPUs. In embodiments, the analog isolation device such as an isolated analog to digital converter or an isolation op amp.

The analog isolation device can be configured output the signal indicative of the voltage drop across the current sense resistor to all CPUs. An isolation resistor for each CPU can be operatively connected between the isolated analog to digital converter and a respective CPU configured to filter the signal indicative of the voltage drop across the current sense resistor to provide isolated feedback from the XOR to the two or more redundant CPUs. In certain embodiments, a respective field programmable gate array (FPGA) integral with each CPU configured to pre-process the signal indicative of a voltage drop across the current sense resistor for processing by the respective CPU.

In embodiments, the two or more redundant CPUs and the two or more control power sources can be shared across an entirety of components included on the main board and for all channels.

In accordance with at least one aspect of this disclosure, a solid state power controller configured to connect to two or more redundant CPUs can include a transistor configured to connect between a power feed line and a load, a gate driver configured to between an XOR of a main board and the transistor to provide a gate drive signal from a respective CPU, driving the transistor between a first and second state to selectively provide power from the feed line to the load, and a current sense resistor operatively connected to the feed line configured to sense a current from the feed line to the load.

In certain embodiments, the current sense resistor can be operatively connected to a drain of the transistor, and a buffer amp can be operatively connected to the current sense resistor to output a signal indicative of a voltage drop across the current sense resistor to the two or more redundant CPUs. In certain embodiments, the current sense resistor can be operatively connected between a source of the transistor and the load, and an isolated analog device can be operatively connected to the current sense resistor to output a signal indicative of a voltage drop across the current sense resistor to the two or more CPUs.

In embodiments, the controller can include an isolation resistor for each CPU operatively connected between the current sense resistor and a respective CPU to filter a signal indicative of a voltage drop across the current sense resistor to provide isolated feedback from the XOR to the two or more redundant CPUs.

In accordance with at least one aspect of this disclosure, a method can include sharing two or more redundant CPUs among any number of solid state power controllers for any number of channels of a main board, controlling a gate drive signal of the two or more redundant CPUs using an XOR gate, if a respective CPU has failed in an incorrect state, inverting, with the XOR, a gate drive signal of a respective working CPU, and overriding any gate drive signal output from the respective failed CPU.

In certain embodiments, the method can include monitoring a voltage drop across a current sense resistor disposed in a feed line between a drain of a transistor and a feed line to provide isolated feedback from the XOR to the two or more redundant CPUs. In certain embodiments, monitoring a voltage drop across a current sense resistor disposed in a feed line between a source of a transistor and a load to provide isolated feedback from the XOR to the two or more redundant CPUs.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
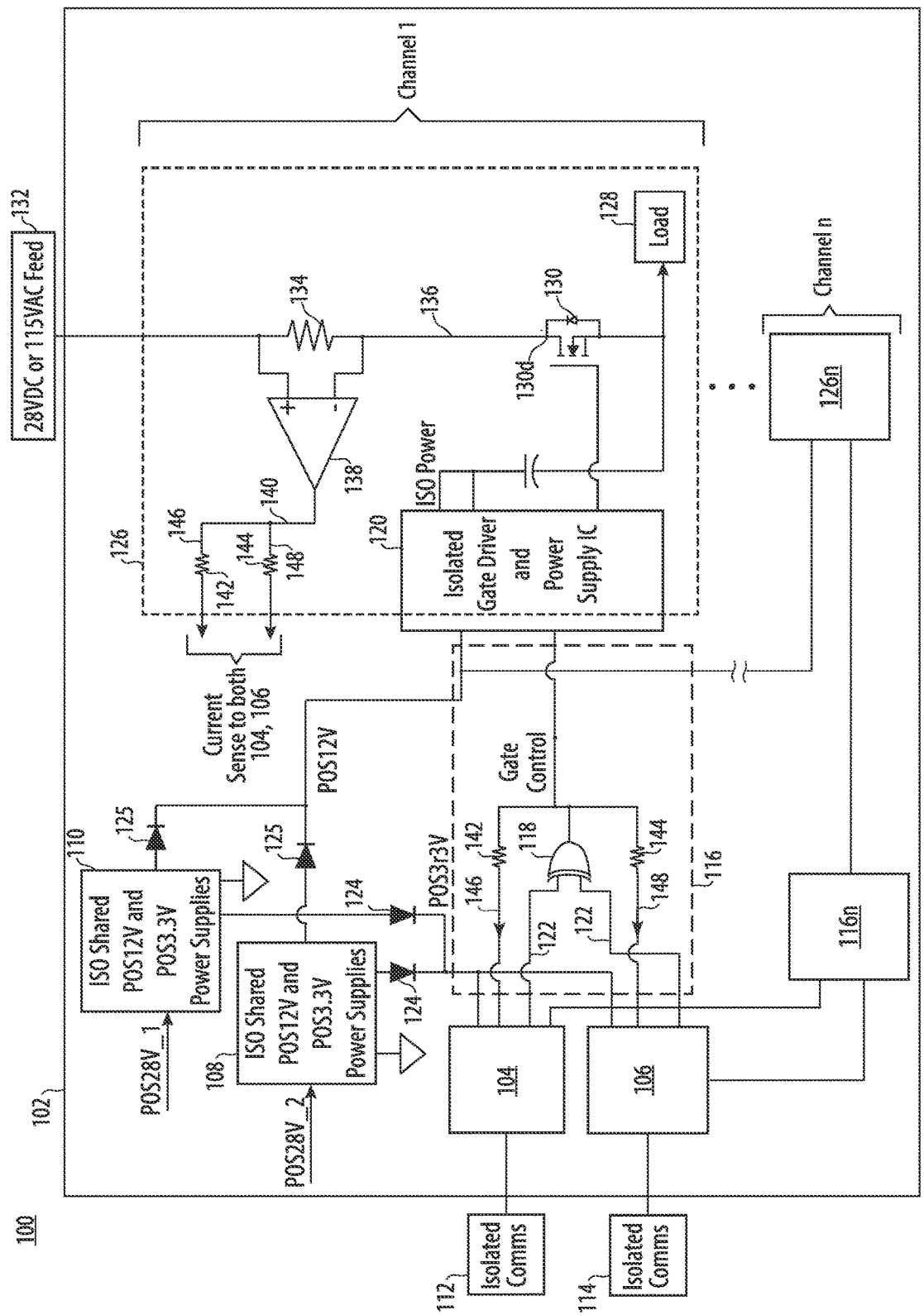
FIG. 1 is a schematic diagram of a portion of a circuit board having redundant controllers in accordance with this disclosure, showing an embodiment of multiple solid state power controllers included on the board.
Figure 2:
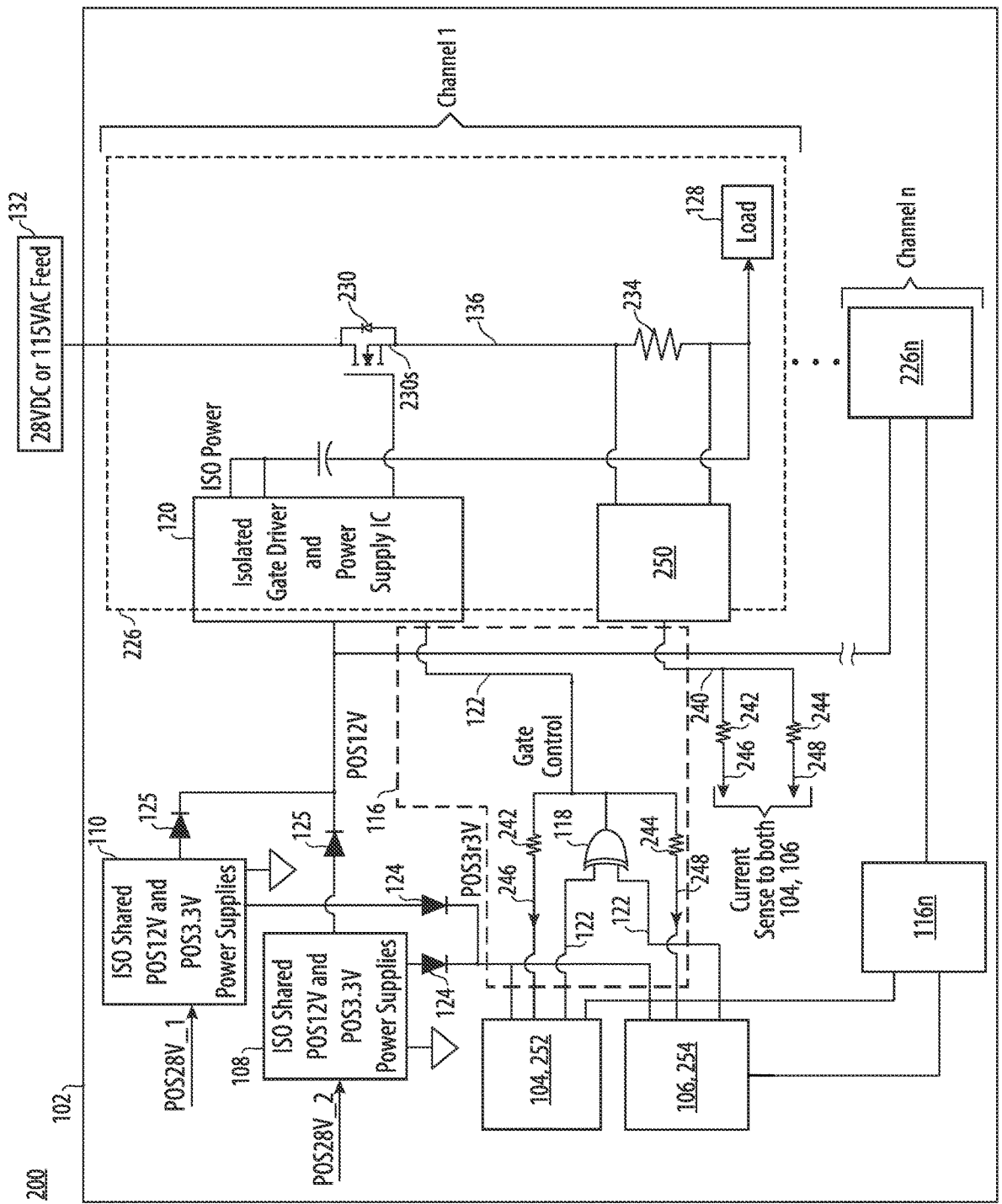
FIG. 2 is a schematic diagram of a portion of a circuit board having redundant controllers in accordance with this disclosure, showing another embodiment of multiple solid state power controllers included on the board.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIG. 2.

Referring to FIG. 1, in accordance with at least one aspect of this disclosure, a system 100 can include a main board 102, two or more redundant CPUs 104, 106 (e.g., two as shown) for any number of channels (e.g., 1 to n as shown) operatively connected to the main board 102 and two or more control power sources 108, 110 operatively connected to provide power to at least one or more of the two or more CPUs 104, 106. A respective isolated communications block 112, 114 can be operatively connected to each of the two or more CPUs 104, 106 configured to provide external communications from other components on the main board 102 to the respective CPU 104, 106. In certain embodiments, the isolated communications blocks 112, 114 communicate between an aircraft main electrical control system and any solid state power controllers (SSPC) on the board 102, and can provide control commands and report status for each channel as well. In embodiments, the channels may also selectively feed power to loads in response to commands from the two or more CPUs 104, 106.

A logic module 116 can be operatively connected to provide redundant control source selection between the two or more redundant CPUs 104, 106, and an exclusive OR gate 118 (XOR) can be operatively connected between the two or more CPUs 104, 106 and an isolated gate driver 120 to control the gate drive signal if the signal outputs 122 are not in agreement. The XOR operates by, for two given logical inputs to XOR 118, returning TRUE if only one of the logic inputs is true and FALSE if both logic inputs are true or both logic inputs are false. If neither logic input is true, the XOR 118 will also return FALSE.

In embodiments, a monitor can determine whether the output state of the logic gate XOR 118 matches the respective output states 122 of the CPUs 104, 106, where gate drive signal output 122 of both CPUs 104 and 106 is in agreement. If the respective output states of the 122 of the CPUs 104, 106 match one another and are not faulted, then the monitor will determine that the output state of the logic gate is correct. If the respective output states 122 of the CPUs 104, 106 match one another and are faulted, then the monitor will determine that the output state of the XOR 118 may not be correct. If the respective output states of 122 of the CPUs 104, 106 do not match, then one CPU is faulted and likely will not attempt to change its output. That allows the un-faulted controller to toggle its output, thereby correcting the control state output of the XOR 118. If the faulted controller tries to change its output state for some reason, then there will likely be the condition of a 'babbling node' which will continuously toggle the controller output sign on and off.

In embodiments, the isolated gate driver 120 may also include its own power supply integrated circuit. In embodiments, the two or more power sources 108, 110 may be combined to operate as a single power source. One or more diodes 124 can be operatively connected between the one or more power sources 108, 110 and the two or more CPUs 104, 106, and one or more diodes 125 can be connected between the one or more power sources 108, 110 and the gate driver 120, each configured to control a direction of flow of power to the two or more redundant CPUs 104, 106 and the gate driver 120. Combining the power sources 108, 100 may be dependent on certain failure modes and/or channel availability. When combined, the power sources 108, 110 may provide power to both CPUs through both diodes together, or the power sources 108, 110 each provide power to a single of CPUs 104, 106.

One or more SSPCs 126 can be operatively connected to the two or more redundant CPUs 104, 106 through the XOR 118 to provide power to a load 128 based on the signal 122 provided by a respective CPU 104, 106. Any number of SSPCs 126 can be included, for example one SSPC 126 for each channel included (e.g., up to and including 32 channels for a single main board 102). However, regardless of the number of channels and/or SSPCs 126, all SSPCs 126 included will share the same two or more redundant CPUs 104, 106, for example as shown in FIG. 1 with respect to SSPC $126_1$ and $126_n$. In embodiments, the two or more redundant CPUs 104, 106, and the two or more power sources 108, 110 can all be shared across an entirety of components included on the main board 102, including all SSPCs 126 and for all channels.

Still with reference to FIG. 1, in certain embodiments, the SSPC 126 can include the isolated gate driver 120 operatively connected between the XOR 118 and a transistor 130. Although only one transistor 130 is shown, any suitable number of transistors can be connected in parallel to provide the amount of current needed to the load. Moreover, any number of transistors may be used per channel (e.g., up to about 24). The isolated gate driver 120 can be configured to provide the gate drive signal 122 from the respective CPU 104, 106 to the transistor 130 to drive the transistor 130 between a first and second state. The transistor 130 can be operatively connected between the isolated gate driver 120 and the load 128 configured to selectively allow power to flow from a feed line 132 to the load 128. As shown, a current sense resistor 134 can be operatively connected in a line 136 and to a drain 130d of the transistor 130 to sense a current from the feed line 132 to the load 128. A buffer amp 138 (e.g., an op amp as shown) can be operatively connected between the current sense resistor 134 and the two or more CPUs 104, 106 configured to output a signal 140 indicative of a voltage drop across the current sense resistor 134 to the two or more redundant CPUs 104, 106. By referencing a line side back to the CPU 104, an additional, separate power supply is not needed to run the buffer amp 138, and no additional isolators are required. Such an arrangement therefore allows for both consolidation of parts and elimination of components, reducing the overall hardware required for the SSPC 126.

The buffer amp 138 can transfer the value of the voltage drop (e.g., signal 140) across the sense resistor 134 back to all CPUs 104, 106 through a respective isolation resistor 142, 144. One isolation resistor 142, 144 can be included for each CPU 104, 106 and operatively connected between the buffer amp 138 and the respective CPU 104, 106, configured to filter the signal 140 indicative of the voltage drop across the current sense resistor 134 to provide isolated feedback from the XOR 118 to the two or more redundant CPUs 104, 106.

The series isolation resistors 142, 144 can be included in feedback lines 146, 148 to isolate the two CPUs 104, 106 from each other so that, in the event of a fault in one CPU, the faulty signal cannot affect the signal 122 going to the other CPU. Therefore, a failed CPU does not cause a loss of any channel based on its failure alone. It should be understood that while these resistors 142, 144 can be used to detect a fault from the XOR 118, the logic gate error cannot be corrected if the logic gate itself is the source of the fault. Although the logic gate itself can be faulted, as described above, it will only affect that one channel, so that all the other channels controlled by the two controllers are unaffected by a logic gate fault. In embodiments, the resistors 142, 144 can have impedance values ranging from 1 Kohm up to 100 Kohm.

Turning now to FIG. 2, a system 200 can have similar components as in system 100. For brevity, the description of common elements that have been described above are not repeated with respect to FIG. 2. In the system 200, the current sense resistor 234 can be operatively connected between a source 230s of the transistor 230 and the load 128 configured to sense a current from the feed line 132 to the load 128. In this case, the current sense resistor 234 can be kept in line with the load 128, allowing the individual channels to remain completely isolated from one another. In certain applications, it may be desirable to have the current sense resistor 234 reference the load 128, or it may be desirable and/or necessary to have the SSPC 226 be more noise immune than a system that references the line side, for example. System 200 provides for this desirability while maintaining the reduced hardware architecture. In addition in certain three phase SSPC modules, there will be at least 3 pairs of CPUs, one for each independent feed, where no pair be coupled together. The system 200 allows for such a configuration by virtue of fully isolating each SSPC in the system.

An isolated analog device (e.g., an analog to digital converter or a buffer amp) 250 can be operatively connected to the current sense resistor 234 configured to output a signal 240 indicative of a voltage drop across the current sense resistor 234 to all CPUs 104, 106 and filter out any common mode noise. Similar to system 100, an isolation resistor 242, 244 can be included for each CPU 104, 106 operatively connected between the isolated analog to digital converter 250 and a respective CPU 104, 106, rather than between the CPU 104, 106 and a buffer amp 138. Again, to resistors 142, 144, the isolation resistors 242, 244 of system 200 can be configured to filter the signal 240 indicative of the voltage drop across the current sense resistor 234 to provide isolated feedback from the XOR 118 to the two or more redundant CPUs 104, 106, to assure that any failure of a CPU does not impact the signals going to the other still working CPU.

Also in system 200, a respective field programmable gate array (FPGA) 252, 254 can be integral with each CPU 104, 106 configured to pre-process the signal 240 indicative of a voltage drop across the current sense resistor 234. Thus, the signal 240 output from the isolated A/D converter 250 goes to a respective FPGA 252, 254 before processing by the respective CPU 104, 106.

In accordance with at least one aspect of this disclosure, any number of SSPCs can be configured to connect to two or more redundant CPUs. The SSPC can take any form as described herein, for example with reference to SSPCs 126 and/or 226. In accordance with at least one aspect of this disclosure, a method for reducing hardware of an SSPC across multiplicity of channels, can include, sharing two or more redundant CPUs (e.g., CPUs 104, 106) among any number of SSPCs (e.g., SSPC 126, 226) for any number of channels of a main board, and controlling a state of a gate drive signal of the two or more redundant CPUs using an XOR gate (e.g., gate 118).

If a respective CPU has failed in an incorrect state, the method can further include, inverting, with the XOR, a gate drive signal of a respective working CPU, regardless of what the incorrect state (or output signal) is, and overriding any gate drive signal output from the respective failed CPU. In this system configuration, if both controllers agree and are not faulted then the logic gate output is correct. If both controllers agree and are faulted then the logic gate output may be wrong. This is a double fault scenario that is not handled by the system of the subject disclosure. The system disclosed herein is used to identify and correct single point faults only.

In embodiments, such as shown in FIG. 1, the method can include, monitoring a voltage drop across a current sense resistor (e.g., resistor 134) disposed in a feed line between a drain of a transistor (e.g., transistor 130) and a feed line to provide isolated feedback from the XOR to the two or more redundant CPUs. In embodiments, such as shown in FIG. 2, the method can include monitoring a voltage drop across a current sense resistor (e.g., resistor 234) disposed in a feed line between a source of a transistor (e.g., transistor 230) and a load to provide isolated feedback from the XOR to the two or more redundant CPUs.

In a typical board construction, using current technology architecture, there is a small CPU allocated for each SSPC and all the support hardware including isolated power supplies and isolated communications must be duplicated for each and every channel. This takes a considerable amount of board space, meaning only about 20 SSPCs for 20 channels can be included on a board for a feature rich controller, or about 32 SSPCs for simpler implementations.

Because embodiments share the main control components across all SSPCs, and certain hardware for each SSPC can be consolidated, the total amount of hardware required for each SSPC can be drastically reduced to allow for more SSPCs and channels to be included on a single board, even if feature rich. For example, at least 32 high end SSPCs may be able to be included on a single board instead of 20.

For example, current techniques to achieve high density, high performance functionality, and no single point faults that affect more than a single channel, can include using a small single chip embedded controller for each SSPC, along with a pair of redundant processors for the board that monitor built in test functions and coordinate communications in and out of the CPUs. But this approach can limit the SSPC count per card, because there can be between 35 and 50 individual parts for support circuits for each and every SSPC, and none of those parts can be easily shared.

Embodiments therefore can provide a method for eliminating or reducing all individual embedded controllers for each SSPC and use the two or more redundant board level CPU's to perform all control and monitor functions for all of the SSPC channels on the board. In certain embodiments, such as in system 100, an isolated gate control can be included to power the transistor switches (e.g., MOSFET(s)). By combining new technology components with a unique redundant control source selection logic element, many copies of piece parts per SSPC can be eliminated.

An exclusive OR gate (XOR) can be included that combines the two CPU control signals, and a pair of resistors can be included to provide isolated feedback from the XOR output back to each of the CPU's to confirm the correct state. If one of the CPUs has failed so that drive signals are stuck in the wrong state for any reason, the XOR can command the functioning CPU to invert it's drive state to force the SSPC gate driver to the correct state regardless of which state the faulted CPU has faulted in. The logic module may also act to override any signal output from the failed CPU so that the failed CPU does not interfere with the working CPU.

In certain embodiments of system 100, for example using a three phase AC module, a total of six CPUs, rather than two, placing two redundant CPU's on each phase. Further, in such embodiments, back to back MOSFET(s) can be included in the feed line to allow for full wave control. Additionally, isolated communication blocks may be included for all communications coming from outside the board to pass through the isolated links before reaching the CPU, since the CPUs may not be ground referenced in certain embodiments. Embodiments may also include new technology parts that combine very small isolated gate drive power supplies with the gate driver, where the gate drive signal is isolated because it floats on and tracks the load voltage. While the communications blocks are isolated in system 100, because the CPUs are not referenced to electrical ground but are referenced to the feed line instead, in system 200, the CPUs are ground referenced and therefore do not require isolation for the communications blocks.

Certain embodiments of system 100 can include a novel arrangement, linking the redundant CPU power supplies with the feed side of the power line and placing the load current sense shunt between the feed and the MOSFET switch(s), rather than after the MOSFET(s) as in typical designs. This allows the feed line to be a common reference for both the current sense shunt and a CPU A/D (if included), thus allowing the direct coupling of the A/D input from a buffer amplifier and the current shunt. Such an arrangement can also eliminate the need for the for a CPU companion FPGA, since the A/D can be directly coupled to the CPU instead of outputting a serial delta sigma data stream that needs reconstructed.

Embodiments include new and improved parts, arranged in a new architecture so as to reduce the total amount piece parts per SSPC, e.g., from about 35 to 50, to about 10 to 15. Such a reduction allows for a major reduction of board area, cost, and also improvement of mean time between failures since there are much fewer parts to fail for each SSPC. By moving much of the features and control back to the board level redundant CPUs and FPGAs, these features are then part of the redundantly protected functions instead of the individual single point failure functions realized by the current generation of SSPCs that use a CPU for each channel.

Embodiments therefore allow for more SSPCs to be included in the same size PCB than previous construction, thereby reducing system cost by using fewer PCBs to achieve the same system. A reduction in parts count can also saves cost in parts materials, assembly, test, and inventory. Embodiments can reduce the failure rate of an individual SSPC by moving many functions and features from individual SSPC channels back to redundant board level CPUs.

In certain embodiments, such as in system 200, each CPU may include a companion FPGA along with isolated gate control to the power MOSFET(s) and isolated analog coupling for monitoring the load current. Here, the use of a companion FPGA can also include two digital filters (e.g., isolation resistors 242, 244) per SSPC channel and will pick up and monitor and correct the gate control channels and feedback. Each SSPC channel can have a delta sigma A/D converter that converts the load current voltage to a digital serial stream, and each FPGA can have two filters to filter that incoming serial stream. The first filter can be a very fast two or three pole filter that can detect when an instant trip is needed. In embodiments, the first filter can have a rise time response rate of about 1 μsec to 2 μsec. In embodiments, the second filter can be a slower, four or six pole rate digital filter that can provide high accuracy current readings for use in the trip curve and load current reporting.

Additionally, the FPGAs can include the logic to drive the gate signals to the individual XOR gates, monitor the feedback signals from the output of the XOR gates, and correct any errors by inverting the gate drive signal when needed and reporting the fault to the CPU. Other functions that may be relegated to the FPGA can include built in test functions such as fuse link monitoring and load voltage filtering utilizing a second separate A/D. In addition to the advantages of embodiments described above, embodiments can include an FPGA in order to maintain a reasonably sized CPU. For example, consolidating all channel control to single redundant CPUs would require more processing by the redundant CPU (e.g., 32 more processing is using 32 channels) than a CPU that only handles one channel. Therefore, pairing the CPU with an FPGA, especially in the case of the isolated A/D, allows for the CPU to remain relatively small and simple. A delta sigma part that requires complex digital filtering on the CPU side of the isolated A/D to reconstruct the signal, in addition to other functions, will be accomplished inside the FPGA before shipping the much slower rate data over to the CPU for final processing. Each companion FPGA, thus, can be used for the high speed digital filtering needed to support the multichannel delta sigma A/D channels carrying load current information.

To protect critical functions in this way, several prerequisites are needed. The system must be able to detect any failures of functions that need to be maintained during a component fault. The system must have separate and additional circuits that can perform the critical functions. The system must be able to block or isolate the failed components from the control output functions that need to continue so that a 'stuck-at' fault cannot lock the output of the function into an undesired state. Otherwise, the system must be able to compensate for that error if it can't block or isolate the failed component.

The system must also be able to link the functional backup circuits into the path of the normal functions, so that needed inputs can be accepted from other circuits and systems to enable the function to continue to make decisions. Only a valid backup signal should be allowed to intervene with the output signal and the system must be able to block or ignore a backup signal that is faulted, as in some cases the backup signal may be the failed signal and the operating signal may be the one that is correct.

The system should be able to detect a failure in its backup circuits before or during operational use, so that a failed backup does not incorrectly take over functional control when it is not working correctly. The system should also be able to report any faults detected and whether the backup circuits have taken control. In the past, there have been a number of ways to implement these type of redundant protective functions, each with its own level of fault tolerance and percent of functional redundancy. From basic coding logic theory, it is known that two pieces of information must be compared to determine if there has been an error, but with only two, a determination cannot be made as to which of the two pieces of information is correct. Therefore, it takes a third piece of information to 'vote' and select the correct action for the function.

In the past, then, basic redundant operation has typically required normally three independent circuits to vote on what a function should be doing and to assure that a failed circuit cannot interfere with the remaining working circuits. Since many functions need 'high availability' or partial redundancy, there is also a method of using two independent circuits to create what is referred to as a 'Fail Passive' system. Most 'Fail Passive' systems include things like watchdog timers and/or cross channel communications checking to determine if a controller is failed and not if the actual control signal is wrong. In these cases, the controller gets locked out of control regardless of whether the actual output control signal is correct or wrong. Typically, watchdog timer monitors and cross controller channel communications regularly pass a 'token' or message back and forth to confirm they are actively working.

This kind of system cannot assure that all faults are corrected by a voting system, but it can assure that a failed circuit can be 'locked out' of control, so that no hazardous conditions result from the failed circuit going rogue. This allows just two circuits to provide full redundancy for many failures. For example, where the original fault is passive and not acting to interfere with the redundant circuit, and providing 'failsafe' states for others where the fault on one circuit could interfere with the operation of the backup circuit. Accordingly, the systems and methods described herein provide distinct technical advantages over prior systems.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A system comprising:
a main board;
two or more redundant central processing units (CPUs) operatively connected to the main board;
two or more control power sources operatively connected to provide power to at least one of the two or more redundant CPUs;
a logic module configured to provide redundant control source selection between the two or more redundant CPUs, the logic module comprising:
an exclusive OR (XOR) gate operatively connected between the two or more redundant CPUs and a gate driver, the XOR gate configured to receive signal outputs from the two or more redundant CPUs and generate a gate drive signal; and
a solid state power controller operatively connected to the two or more redundant CPUs through the XOR gate, the solid state power controller configured to provide power to a load based on the gate drive signal provided by the XOR gate.

2. The system as recited in claim 1, wherein:
the solid state power controller further includes the gate driver operatively connected between the XOR gate and a transistor; and
the gate driver is configured to receive the gate drive signal from the XOR gate and drive the transistor between a first state and a second state.

3. The system as recited in claim 2, wherein:
the solid state power controller further includes the transistor; and
the transistor is operatively connected between the gate driver and the load, the transistor configured to selectively allow the power to flow from a feed line to the load.

4. The system as recited in claim 3, wherein the solid state power controller further includes a current sense resistor operatively connected to a drain of the transistor, the current sense resistor configured to sense a current from the feed line to the load.

5. The system as recited in claim 4, wherein the solid state power controller further includes a buffer amp operatively connected between the current sense resistor and the two or more redundant CPUs, the buffer amp configured to output a signal indicative of a voltage drop across the current sense resistor to the two or more redundant CPUs.

6. The system as recited in claim 5, wherein:
the buffer amp is configured to output the signal indicative of the voltage drop across the current sense resistor to all of the two or more redundant CPUs; and
the solid state power controller further includes an isolation resistor for each of the two or more redundant CPUs, the isolation resistors operatively connected between the buffer amp and respective ones of the two or more redundant CPUs, the isolation resistors configured to filter the signal indicative of the voltage drop across the current sense resistor to provide isolated feedback from the XOR gate to the two or more redundant CPUs.

7. The system as recited in claim 3, wherein the solid state power controller further includes a current sense resistor operatively connected between a source of the transistor and the load, the current sense resistor configured to sense a current from the feed line to the load.

8. The system as recited in claim 7, wherein the solid state power controller further includes an analog isolation device operatively connected to the current sense resistor, the analog isolation device configured to output a signal indicative of a voltage drop across the current sense resistor to the two or more redundant CPUs.

9. The system as recited in claim 8, wherein:
the analog isolation device is configured to output the signal indicative of the voltage drop across the current sense resistor to all of the two or more redundant CPUs; and
the solid state power controller further includes an isolation resistor for each of the two or more redundant CPUs, the isolation resistors operatively connected between the analog isolation device and respective ones of the two or more redundant CPUs, the isolation resistors configured to filter the signal indicative of the voltage drop across the current sense resistor to provide isolated feedback from the XOR gate to the two or more redundant CPUs.

10. The system as recited in claim 9, wherein the isolation resistors are included in multiple feedback lines, the multiple feedback lines isolated from one another.

11. The system as recited in claim 8, further comprising:
a respective field programmable gate array (FPGA) integral with each of the two or more redundant CPUs, each FPGA configured to pre-process the signal indicative of the voltage drop across the current sense resistor for processing by the respective CPU.

12. The system as recited in claim 1, further comprising:
diodes operatively connected between the two or more control power sources and the two or more redundant CPUs, the diodes also connected between the two or more control power sources and the gate driver, the diodes configured to control a direction of flow of power to the two or more redundant CPUs and power to the gate driver.

13. The system as recited in claim 1, further comprising:
a respective isolated communications block operatively connected to each of the two or more redundant CPUs.

14. The system as recited in claim 1, wherein the two or more redundant CPUs and the two or more control power sources are shared across an entirety of components included on the main board, including multiple channels.

15. A solid state power controller comprising:
a power feed line;
a transistor;
a gate driver connected to the transistor, the gate driver configured to receive a gate drive signal and drive the transistor between a first state and a second state based on the gate drive signal to selectively provide power from the power feed line to a load;
a current sense resistor operatively connected to the power feed line, the current sense resistor configured to sense a current from the power feed line to the load, the current sense resistor operatively connected to a drain of the transistor;
a buffer amp operatively connected to the current sense resistor, the buffer amp configured to output a signal indicative of a voltage drop across the current sense resistor; and
an isolation resistor on each of multiple feedback lines, each isolation resistor operatively connected between the current sense resistor and an output of a respective feedback line.

16. The solid state power controller as recited in claim 15, wherein the isolation resistors are configured to filter the signal indicative of a voltage drop across the current sense resistor to provide isolated feedback from an external gate.

17. The solid state power controller as recited in claim 16, wherein the multiple feedback lines are isolated from one another.

18. A solid state power controller comprising:
a power feed line;
a transistor;
a gate driver connected to the transistor, the gate driver configured to receive a gate drive signal and drive the transistor between a first state and a second state to selectively provide power from the power feed line to a load;
a current sense resistor operatively connected to the power feed line, the current sense resistor configured to sense a current from the power feed line to the load, the current sense resistor operatively connected between a source of the transistor and the load;
an isolated analog device operatively connected to the current sense resistor, the isolated analog device configured with an output that supplies a signal indicative of a voltage drop across the current sense resistor; and
an isolation resistor on each of multiple feedback lines, each isolation resistor operatively connected between the output of the isolated analog device and an output of a respective feedback line.

19. The solid state power controller as recited in claim 18, wherein the isolation resistors are configured to filter the signal indicative of the voltage drop across the current sense resistor to provide isolated feedback from an external gate.

20. The solid state power controller as recited in claim 18, wherein the isolated analog device comprises an analog-to-digital converter or a buffer amp.

* * * * *